United States Patent
Kim et al.

(10) Patent No.: US 10,886,161 B2
(45) Date of Patent: Jan. 5, 2021

(54) SEMICONDUCTOR DEVICE USING INTER-DIFFUSION AND METHOD FOR MANUFACTURING THE SAME

(71) Applicant: KOREA INSTITUTE OF SCIENCE AND TECHNOLOGY, Seoul (KR)

(72) Inventors: Hyung-jun Kim, Seoul (KR); Sanghyeon Kim, Seoul (KR); Hansung Kim, Seoul (KR); Seong Kwang Kim, Seoul (KR); Hyeong Rak Lim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/282,299

(22) Filed: Feb. 22, 2019

(65) Prior Publication Data
US 2019/0287846 A1 Sep. 19, 2019

(30) Foreign Application Priority Data

Mar. 14, 2018 (KR) .................... 10-2018-0029553

(51) Int. Cl.
| | |
|---|---|
| H01L 21/762 | (2006.01) |
| H01L 21/683 | (2006.01) |
| H01L 29/06 | (2006.01) |
| H01L 21/02 | (2006.01) |
| H01L 21/78 | (2006.01) |

(52) U.S. Cl.
CPC .. H01L 21/76251 (2013.01); H01L 21/02463 (2013.01); H01L 21/02532 (2013.01);
(Continued)

(58) Field of Classification Search
CPC ......... H01L 21/76251; H01L 21/02463; H01L 21/02532; H01L 21/6835; H01L 21/7806; H01L 29/0649
See application file for complete search history.

(56) References Cited

U.S. PATENT DOCUMENTS

| | | | | |
|---|---|---|---|---|
| 7,872,252 B2 * | 1/2011 | Puetz | ................ | H01L 21/02381 257/13 |
| 10,177,269 B2 * | 1/2019 | Gershon | ............... | H01L 31/072 |

(Continued)

FOREIGN PATENT DOCUMENTS

| | | |
|---|---|---|
| JP | 2002503390 A | 1/2002 |
| JP | 200519424 A | 1/2005 |

(Continued)

OTHER PUBLICATIONS

C.K. Chia et al., "Effects of AlAs interfacial layer on material and optical properties of GaAs/Ge(100) epitaxy", Applied Physics Letters, 2008, 3 pages, vol. 92, No. 141905, American Institute of Physics.

(Continued)

Primary Examiner — Timor Karimy
(74) Attorney, Agent, or Firm — Cantor Colburn LLP

(57) ABSTRACT

A method for manufacturing a semiconductor device according to embodiments may include forming a sacrificial layer on a first substrate including first dopant atoms and second dopant atoms, and forming a germanium (Ge) layer on the sacrificial layer. Here, the germanium (Ge) layer may include the first dopant atoms diffused from the first substrate by growth temperature in the forming step. Additionally, the method for manufacturing a semiconductor device may further include annealing after growth of the germanium (Ge) layer so that the germanium (Ge) layer may include second dopant atoms.

12 Claims, 9 Drawing Sheets

(52) U.S. Cl.
CPC ...... *H01L 21/6835* (2013.01); *H01L 21/7806* (2013.01); *H01L 29/0649* (2013.01)

(56) References Cited

U.S. PATENT DOCUMENTS

| | | |
|---|---|---|
| 2009/0261381 A1 | 10/2009 | Kim et al. |
| 2011/0036289 A1* | 2/2011 | Carothers ........... H01L 21/0245 |
| | | 117/94 |
| 2011/0303273 A1* | 12/2011 | Harper .................... H01L 31/18 |
| | | 136/255 |
| 2013/0240936 A1* | 9/2013 | Seo .......................... H01L 33/60 |
| | | 257/98 |
| 2016/0276612 A1 | 9/2016 | Gotanda |
| 2018/0076084 A1 | 3/2018 | Kim et al. |

FOREIGN PATENT DOCUMENTS

| | | |
|---|---|---|
| JP | 2016178156 A | 10/2016 |
| JP | 2017208569 A | 11/2017 |
| KR | 1020070068530 A | 7/2007 |
| KR | 100817217 B1 | 3/2008 |
| KR | 1020090110667 A | 10/2009 |
| KR | 1020130138711 A | 12/2013 |
| KR | 1020160102970 A | 8/2016 |
| KR | 1020180029663 A | 3/2018 |
| WO | 199828798 A1 | 7/1998 |
| WO | 2015099784 A1 | 7/2015 |

OTHER PUBLICATIONS

Chi On Chui et al., "Germanium n-type shallow junction activation dependences", Applied Physics Letters, 2005, 3 pages, vol. 87, No. 091909, American Institute of Physics.

G Scappucci et al., "Phosphorus atomic layer doping of germanium by the stacking of multiple δ layers", Nanotechnology, 2011, pp. 1-5, vol. 22, No. 375203.

Prucnal et al., "Ultra-doped n-type germanium thin films for sensing in the mid-infrared", Scientific Reports, 2016, pp. 1-8, vol. 6, No. 27643.

* cited by examiner

SEMICONDUCTOR DEVICE USING INTER-DIFFUSION AND METHOD FOR MANUFACTURING THE SAME

CROSS-REFERENCE TO RELATED APPLICATION

This application claims priority to Korean Patent Application No. 10-2018-0029553, filed on Mar. 14, 2018, and all the benefits accruing therefrom under 35 U.S.C. § 119, the contents of which in its entirety are herein incorporated by reference.

BACKGROUND

1. Field

Exemplary embodiments relate to the manufacture of a semiconductor device using inter-diffusion, and more particularly, to the manufacture of a semiconductor device using inter-diffusion of dopant atoms into a germanium (Ge) layer by thermal treatment during or after growth of germanium (Ge).

DESCRIPTION ABOUT NATIONAL RESEARCH AND DEVELOPMENT SUPPORT

This study was supported by Korea Evaluation Institute of Industrial Technology (Project Name. Study of development of wafer bonding process technology for III-V compound semiconductors MOSFET and monolithic 3D integration on silicon substrate, Project No. 1711058699) under the superintendence of Ministry of Science and ICT, Republic of Korea.

2. Description of the Related Art

SOITEC (France) developed a Silicon-on-Insulator (SOI) structure, and SOI made a considerable contribution to the performance improvement of various semiconductor devices. However, it has been difficult to more scale down the size of a silicon (Si) based devices, and it is foreseen that the limitation will be reached in a few years, so there is an increasing interest in new semiconductor devices or device development mechanisms.

Among them, germanium (Ge) as a new semiconductor material has electron mobility that is twice higher and hole mobility that is four times higher than silicon (Si) and thus it is gaining attention as an N-type and P-type metal oxide semiconductor field effect transistor (MOSFET) channel material, and in particular, it is considered as a promising candidate as a P-MOSFET material. Accordingly, the demand and interest in a semiconductor device of GeOI structure dramatically increases.

Conventionally, to manufacture GeOI, a method including hydrogen implantation into a germanium (Ge) layer grown from a germanium (Ge) substrate or a silicon germanium ($Si_xGe_{1-x}$) buffer layer, wafer bonding onto a separate silicon (Si) substrate and splitting of the germanium (Ge) layer only, or a method including wafer bonding of a germanium (Ge) layer-grown silicon germanium ($Si_xGe_{1-x}$) buffer layer onto a silicon (Si) substrate and grinding, leaving only the germanium (Ge) layer, has been used. In addition, the germanium (Ge) condensation technique or liquid phase epitaxy method has been also used.

However, the conventional methods for manufacturing GeOI have limitations because germanium (Ge) crystal quality may be damaged in the dopant implantation process for group III or V elements such as arsenic (As), phosphorous (P), and gallium (Ga), and the activation yield is low due to annealing after dopant implantation. Additionally, another drawback of the conventional methods for manufacturing GeOI is that the process for reducing the thickness of the germanium (Ge) layer to a few tens of nm or less is too technically difficult, and in the surface orientation, it is difficult to manufacture GeOI having a different orientation such as (110) or (111) other than (100) orientation.

Moreover, it is difficult to manufacture N-MOSFET with good quality because it is difficult to achieve a high doping concentration of E19 $cm^{-3}$ or above in the N-type dopant implantation process and the contact resistance is high (for example, contact resistance exceeding E-8 $\Omega\text{-}cm^2$). Additionally, it is difficult to manufacture a complementary device in which both N-type and P-type are the same type of channel material based on germanium.

Meanwhile, it is difficult to manufacture N-type GeOI, and to address the limitation, an attempt has been made to manufacture a complementary device in which N-MOSFET is based on indium gallium arsenide (InGaAs) and only P-MOSFET is based on germanium (Ge), but manufacturing a complementary device using different types of materials is not practical in aspect of process cost.

RELATED LITERATURES

Patent Literatures (Patent Literature 1) Patent Publication No. 10-2009-0110667
(Patent Literature 2) Patent Publication No. 10-2013-0138711
(Patent Literature 3) Patent Publication No. 10-2016-0102970

SUMMARY

According to an aspect of the present disclosure, there is an N-type and/or P-type germanium (Ge) semiconductor device using inter-diffusion and a method for manufacturing the same.

A method for manufacturing a semiconductor device according to an aspect of the present disclosure may include forming a sacrificial layer on a first substrate including first dopant atoms and second dopant atoms, and forming a germanium (Ge) layer on the sacrificial layer. Here, the germanium (Ge) layer includes the first dopant atoms diffused from the first substrate by growth temperature in the forming step.

In an embodiment, the method for manufacturing a semiconductor device may further include annealing the first substrate. Here, the annealing the first substrate may include decreasing concentration of the first dopant atoms included in the germanium (Ge) layer based on escapement of the first dopant atoms.

In an embodiment, the annealing the first substrate may further include increasing concentration of the second dopant atoms included in the germanium (Ge) layer based on delayed diffusion of the second dopant atoms.

In an embodiment, the sacrificial layer may include one selected from the group consisting of gallium arsenide (GaAs), aluminum arsenide (AlAs) and aluminum gallium arsenide (AlGaAs) or combinations of at least two of them.

In an embodiment, the sacrificial layer may have binding energy between the first dopant atoms and other atoms included in the sacrificial layer that is higher than binding energy between the first dopant atoms and the second dopant atoms included in the first substrate.

In an embodiment, the first substrate may be made of gallium arsenide (GaAs), and the sacrificial layer may be formed on the first substrate by an epitaxy growth method.

In an embodiment, surface orientation of the first substrate may be any one of (100), (110) and (111).

In an embodiment, the method for manufacturing a semiconductor device may further include forming a first capping layer on the germanium (Ge) layer before annealing the first substrate.

In an embodiment, the method for manufacturing a semiconductor device may further include removing the first capping layer after annealing the first substrate.

In an embodiment, the method for manufacturing a semiconductor device may further include forming a second capping layer including the first dopant atoms on the germanium (Ge) layer before forming the first capping layer, and annealing the second capping layer after forming the first capping layer. Here, the second capping layer may have an amorphous structure.

In an embodiment, the method for manufacturing a semiconductor device may further include removing the second capping layer after removing the first capping layer.

In an embodiment, the forming the first capping layer on the germanium (Ge) layer may include forming the first capping layer on a portion of surface of the germanium (Ge) layer.

In an embodiment, the method for manufacturing a semiconductor device according to the above-described embodiments may further include forming an insulating layer on a second substrate, bonding the germanium (Ge) layer onto the insulating layer, and etching the sacrificial layer with the germanium (Ge) layer being bonded to the insulating layer, to split the sacrificial layer and the first substrate.

A semiconductor device according to another aspect of the present disclosure may include a sacrificial layer disposed on a substrate, and a germanium (Ge) layer disposed on the sacrificial layer. Here, the germanium (Ge) layer includes first dopant atoms diffused from the substrate by growth temperature during formation of the germanium (Ge) layer.

In an embodiment, the germanium (Ge) layer may further include second dopant atoms diffused from the substrate by annealing applied after the germanium (Ge) layer is formed, and a concentration of the second dopant atoms may be higher than a concentration of the first dopant atoms.

In an embodiment, a portion of the germanium (Ge) layer may have the concentration of the first dopant atoms that is higher than the concentration of the second dopant atoms, and the other portion of the germanium (Ge) layer may have the concentration of the second dopant atoms that is higher than concentration of the first dopant atoms.

In an embodiment, the semiconductor device may further include a first capping layer disposed on a portion of the germanium (Ge) layer.

In an embodiment, the semiconductor device may further include a second capping layer disposed between the germanium (Ge) layer and the first capping layer. Here, the second capping layer includes first dopant atoms with an amorphous structure.

In the semiconductor device according to the above-described embodiments, the substrate is made of gallium arsenide (GaAs).

A semiconductor device according to still another aspect of the present disclosure may include an insulating layer disposed on a substrate, and a germanium (Ge) layer disposed on the insulating layer. Here, the germanium (Ge) layer includes first dopant atoms diffused by growth temperature during formation of the germanium (Ge) layer.

In an embodiment, the germanium (Ge) layer may have a concentration of second dopant atoms that is higher than a concentration of the first dopant atoms by annealing applied after the germanium (Ge) layer is formed.

In an embodiment, a portion of the germanium (Ge) layer may have the concentration of the first dopant atoms that is higher than the concentration of the second dopant atoms, and the other portion of the germanium layer may have the concentration of the second dopant atoms that is higher than the concentration of the first dopant atoms.

In the semiconductor device according to the above-described embodiments, the substrate is made of silicon (Si).

According to the method for manufacturing a semiconductor device according to an aspect of the present disclosure, because the lattice constant of gallium arsenide (GaAs) which is a substance of a substrate is substantially the same as the lattice constant of germanium (Ge), dislocation hardly occurs when growing a germanium (Ge) layer on the substrate. Accordingly, it is possible to obtain a germanium (Ge) semiconductor device having an epitaxy growth structure free of lattice mismatch.

Additionally, the germanium (Ge) layer may include N-type dopant atoms and/or P-type dopant atoms using inter-diffusion without a dopant implementation process in determining the polarity of the germanium (Ge) layer. Because inter-diffusion requires a smaller amount of energy than dopant implantation, crystallization damage of germanium (Ge) caused by dopant implantation does not occur. Accordingly, there is no need for a separate process for improving germanium (Ge) crystallization such as curing annealing.

In this process, inter-diffusion may be controlled by simply controlling the thermal treatment condition, and thus it is possible to determine the polarity of the germanium (Ge) layer without a complex process.

Further, the concentration of dopant atoms may be enhanced by the role of diffusion barrier of the capping layers in determining the polarity of the germanium (Ge) layer using inter-diffusion. In particular, it is possible to obtain high concentration (for example, E19 $cm^{-3}$ or above) which leads to sufficiently low contact resistance in manufacturing an N-type semiconductor device.

Additionally, a separate buffer layer (for example, a silicon germanium ($Si_xGe_{1-x}$) buffer layer) is unnecessary, and thus it is possible to obtain a semiconductor device including a ultra-thin body Ge layer in which the thickness of the germanium (Ge) active layer is scaled down to a few to a few tens of nm.

Additionally, the structure of a semiconductor device is formed by wafer bonding and Epitaxial Lift-Off (ELO) processes using an epitaxy growth structure free of lattice mismatch, and thus after manufacture, the surface roughness of the germanium (Ge) layer is low, which eliminates the need for an additional polishing process.

Further, it is possible to provide a semiconductor device that may be used to manufacture germanium (Ge)-based N-MOSFET and C-MOSFET based on the same type of channel material as germanium (Ge).

BRIEF DESCRIPTION OF THE DRAWINGS

To describe the technical solutions of the embodiments of the present disclosure or the related art more clearly, drawings required for describing the embodiments will be briefly introduced below. To identify similar elements shown in one or more drawings, the same reference numeral is used. It should be understood that the accompanying drawings are provided for illustration purposes only, but not intended to limit the embodiments of the specification. Additionally, certain elements to which various modifications such as exaggeration and omission are applied may be shown in the accompanying drawings for clarity of description.

DETAILED DESCRIPTION

Figure 1:
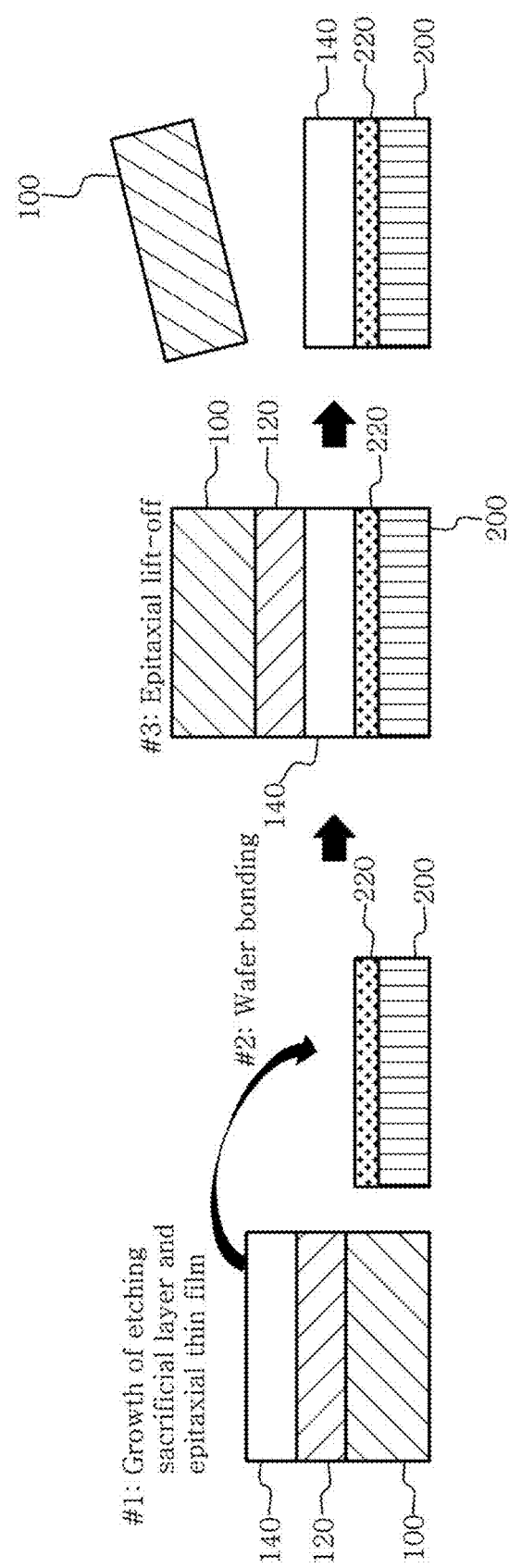
FIG. 1 is a conceptual diagram of a method for manufacturing GeOI according to a first embodiment.

Hereinafter, the embodiments of the present disclosure will be described in detail with reference to the accompanying drawings.

It will be understood that, if an element is referred to as being "above" another element, it can be directly above the other element or intervening elements may be present. In contrast, if an element is referred to as being "directly above" another element, there are no intervening elements present.

The terms "first", "second", and the like are used to describe various parts, components, areas, layers and/or sections, but are not limited thereto. These terms are only used to distinguish one part, component, area, layer or section from another. Accordingly, a first part, component, region, layer or section stated below may be referred to as a second part, component, region, layer or section without departing from the scope of the present disclosure.

The terminology used herein is for the purpose of describing particular embodiments only and is not intended to be limiting of the present disclosure. As used herein, the singular forms are intended to include the plural forms as well, unless the context clearly indicates otherwise. It will be further understood that the terms "comprising" and "including" when used in this specification, specify the presence of stated features, regions, integers, steps, operations, elements, and/or components, but do not preclude the presence or addition of one or more other features, regions, integers, steps, operations, elements, and/or components.

Spatially relative terms (e.g., "beneath", "below", "above" and the like) may be used herein for ease of description in describing a relationship between one element and another as illustrated in the figures. It will be understood that these terms are intended to encompass the intended meaning in the figures as well as different meanings or operations of the device in use. For example, if the device in the figures is turned over, elements described as "below" or "beneath" other elements would then be oriented "above" the other elements. Thus, the term "below" can encompass both an orientation that is above, as well as, below. The device may rotate 90° or at any other angle and the spatially relative terms should be interpreted accordingly.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

According to the embodiments of the present disclosure, it is possible to manufacture an N-type and/or P-type semiconductor device having a high quality germanium (Ge) layer with less germanium crystal damage, and a semiconductor device or a complementary device of high quality N-type or P-type Germanium-on-Insulator (GeOI) structure based on the semiconductor device.

First Embodiment

FIG. 1 is a conceptual diagram of a method for manufacturing GeOI according to a first embodiment. A semiconductor device of germanium (Ge) structure used as a base to manufacture a semiconductor device of GeOI structure includes a substrate (or referred to as a "first substrate") 100, a sacrificial layer 120 and a germanium (Ge) layer 140.

Referring to FIG. 1, the sacrificial layer 120 may be formed on the substrate 100. The substrate 100 may be made of Group DI-V compounds that have good electron transport characteristics and can determine the polarity of the germanium layer.

After the sacrificial layer 120 is formed on the substrate 100, the germanium (Ge) layer 140 may be formed on the sacrificial layer 120. In an embodiment, the sacrificial layer 120 and the germanium (Ge) layer 140 may be formed on the substrate 100 by the epitaxy growth method.

Meanwhile, the substrate 100 and the sacrificial layer 120 are made of a material having the lattice constant that is very close to the lattice constant (0.565 nm) of germanium (Ge). In an embodiment, the substrate 100 may be made of gallium arsenide (GaAs). Additionally, the sacrificial layer 120 is made of one selected from the group consisting of gallium arsenide (GaAs), aluminum arsenide (AlAs) and aluminum gallium arsenide (AlGaAs) or combinations of at least two of them.

The lattice constant of gallium arsenide (GaAs) is 0.56533 nm, the lattice constant of aluminum arsenide (AlAs) is 0.56605 nm, and the lattice constant of aluminum gallium arsenide (AlGaAs) ranges 0.56533-0.56605 nm according to a ratio between gallium (Ga) and aluminum (Al). Because a lattice constant difference between the germanium (Ge) layer 140, and the substrate 100 and the sacrificial layer 120 is very small (0.05-0.18% difference), a defect in atomic structure such as a dislocation do not occur in the process of forming the germanium (Ge) layer 140. Accordingly, the germanium (Ge) layer 140 having high quality crystal structure may be obtained.

Figure 2A:
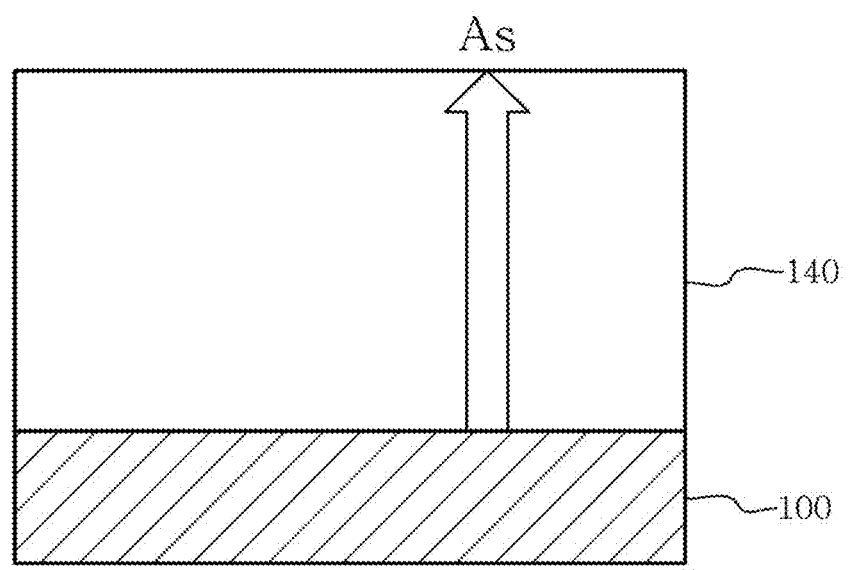
FIGS. 2A to 2C are conceptual diagrams showing an inter-diffusion process of dopant atoms according to a first embodiment.
Figure 2B:
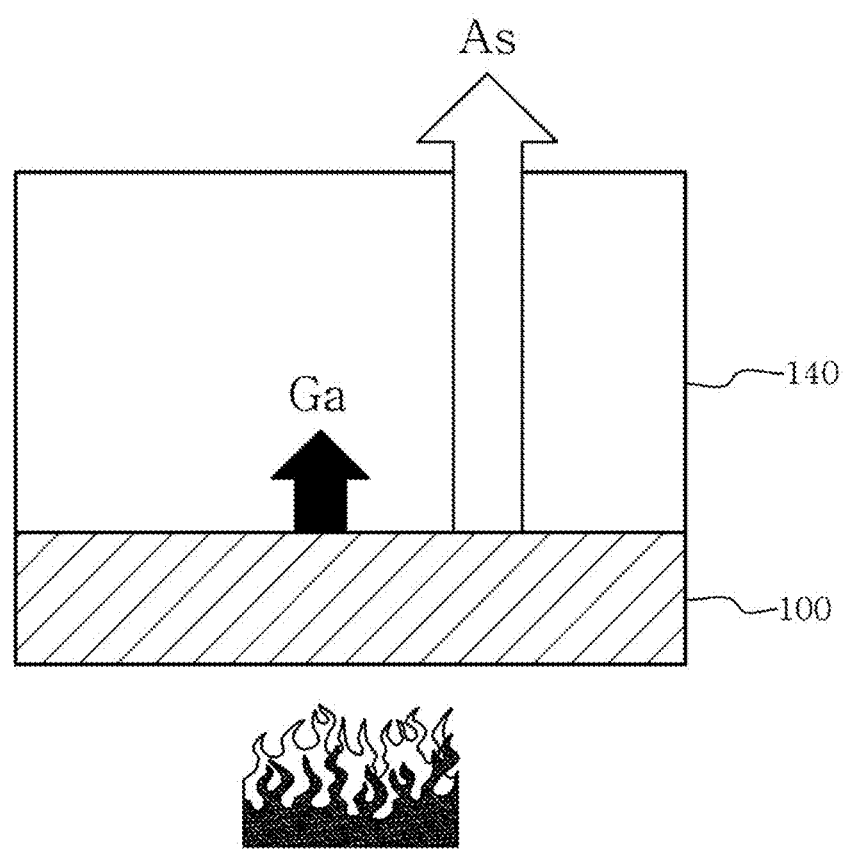
Figure 2C:
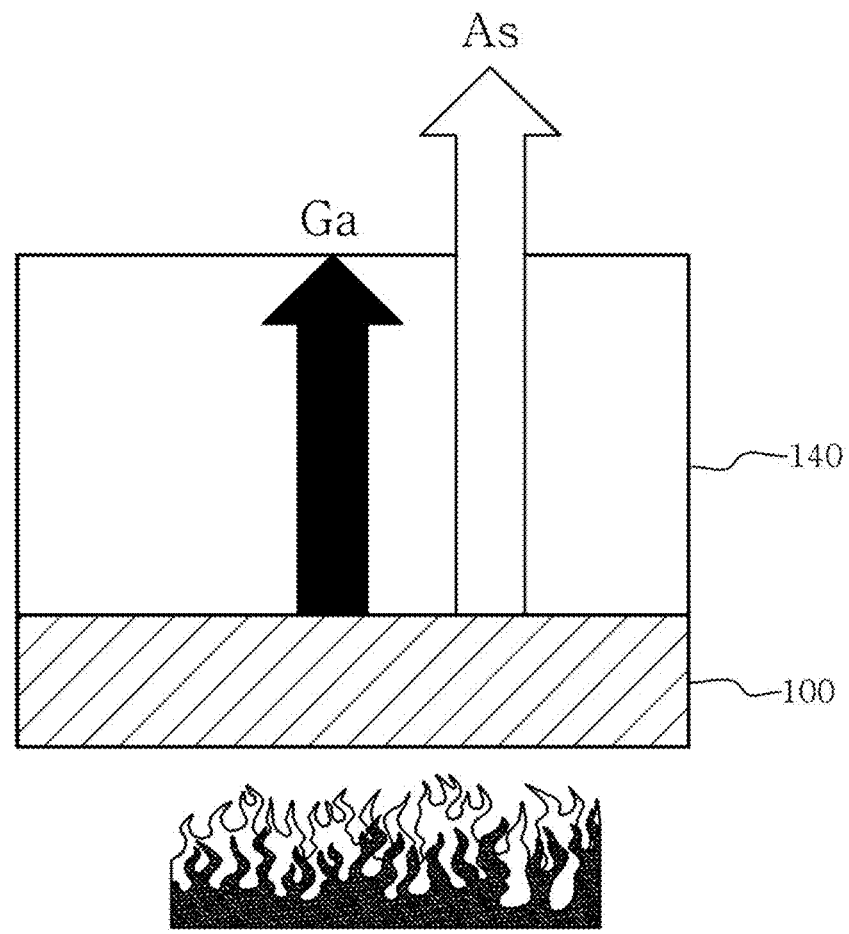

FIGS. 2A to 2C are conceptual diagrams showing an inter-diffusion process of dopant atoms according to the first embodiment. For clarity of description, in FIG. 2, the substrate 100 is made of gallium arsenide (GaAs), and the sacrificial layer 120 is omitted.

When the germanium (Ge) layer 140 is formed on the substrate 100, gallium (Ga) atoms and/or arsenide (As)

atoms in the substrate 100 diffuse into the germanium (Ge) layer 140 from the substrate 100 by the growth temperature of the germanium (Ge) layer or the annealing temperature after growth.

As shown in FIG. 2A, when germanium is grown into the germanium layer 140 on the substrate 100, arsenide (As) atoms first diffuse into the germanium layer 140 during growth of germanium (Ge). It is because the diffusion coefficient of arsenide (As) is higher than the diffusion coefficient of gallium (Ga). When the germanium (Ge) layer 140 is grown as described above, the concentration of arsenide (As) dopant atoms in the germanium (Ge) layer 140 increases, thereby creating an N-type.

Suitable germanium (Ge) growth temperature is the temperature at which arsenide (As) atoms diffuse, but not gallium (Ga) atoms. In some embodiments, the germanium (Ge) growth temperature may be 200° C.

After growth of germanium (Ge), annealing of the substrate 100 may be performed to control the concentration of dopant atoms in the germanium (Ge) layer 140. In an embodiment, the step of annealing includes increasing concentration of the second dopant atoms included in the germanium (Ge) layer, and/or using delayed diffusion of the second dopant atoms into the germanium (Ge) layer from the first substrate. The annealing process described herein is a sort of thermal treatment process for inter-diffusion, and it is different from a curing annealing process for curing crystallization damage caused by ion implantation.

Referring to FIG. 2B, after growth of germanium (Ge), when annealing of the substrate 100 starts, arsenide (As) dopant atoms included in the germanium (Ge) layer 140 diffuse across the germanium (Ge) layer 140 and further away from the germanium (Ge) layer 140, and eventually, escape from the germanium (Ge) layer 140. Also, in the annealing process, gallium (Ga) atoms in the substrate 100 diffuse into the germanium (Ge) layer 140. The diffusion of gallium (Ga) is called to "delayed diffusion" because of being happened after the diffusion of arsenide (As).

Accordingly, it is possible to control the concentration of dopant atoms such as reducing the concentration of arsenide (As) dopant atoms and increasing the concentration of gallium (Ga) dopant atoms through annealing after growth.

Referring to FIG. 2B again, when annealing continues, the concentration of arsenide (As) dopant atoms in the germanium (Ge) layer 140 keeps decreasing and the concentration of gallium (Ga) dopant atoms keeps increasing.

Finally, as shown in FIG. 2C, the gallium (Ga) concentration in the germanium (Ge) layer 140 is much higher than the arsenide (As) concentration, resulting in the P-type germanium (Ge) layer 140. That is, it is possible to control the polarity of the germanium (Ge) layer 140 by annealing after growth of the germanium (Ge) layer 140.

In some embodiments, after growth, the annealing process may be performed at the temperature between 200 and 700° C. When the temperature is higher than 700° C., the surface roughness of the germanium (Ge) layer 140 sharply reduces. In some other embodiments, after growth, the annealing process may be performed at 500° C. or less. In this case, rms roughness value of 1 nm or less may be obtained on the surface of the germanium (Ge) layer 140.

Here, the annealing process of the substrate 100 after growth of germanium (Ge) includes both a continuous process such as increasing the temperature from the temperature of FIG. 2A, or extending the time at the same temperature and a discontinuous process in which each step is individually performed.

In some other embodiments, the concentration of dopant atoms in the germanium (Ge) layer 140 may rely on the germanium (Ge) layer 140. For example, a higher concentration of dopant atoms may be obtained at a smaller thickness of the germanium (Ge) layer 140 under the same thermal condition.

Figure 3:
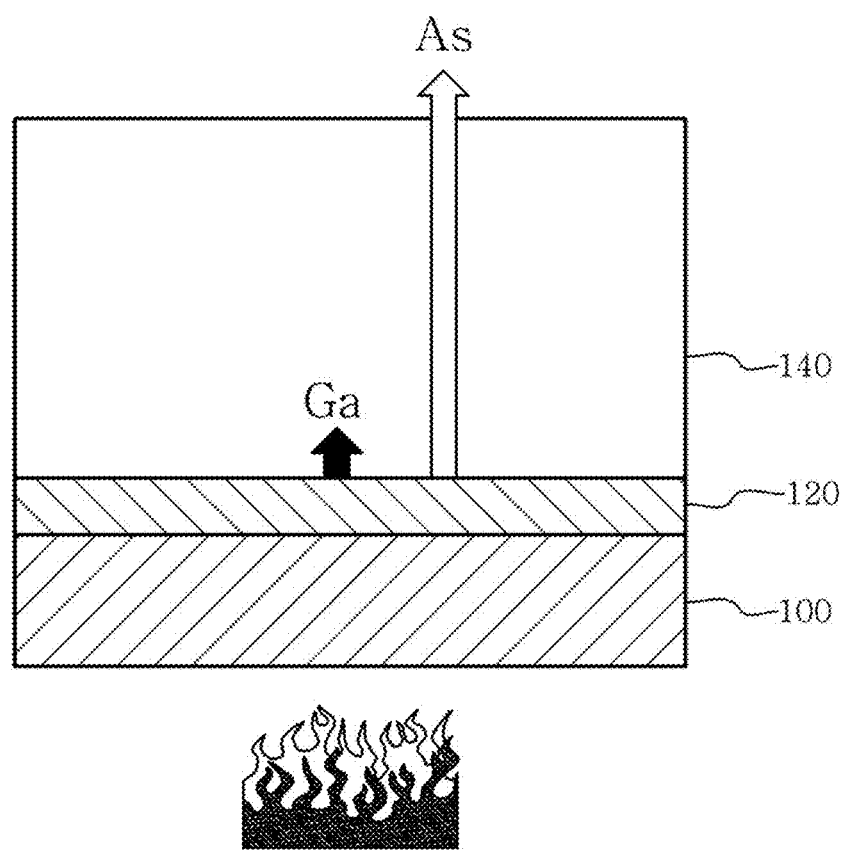
FIG. 3 is a conceptual diagram a process in which inter-diffusion of dopant atoms is reduced by a sacrificial layer according to a first embodiment.

FIG. 3 is a conceptual diagram showing the process in which inter-diffusion of dopant atoms is reduced by the sacrificial layer 120 according to the first embodiment.

As described above, the sacrificial layer 120 is made of one selected from the group consisting of gallium arsenide (GaAs), aluminum arsenide (AlAs) and aluminum gallium arsenide (AlGaAs) or combinations of at least two of them.

In some embodiments, when binding energy between first dopant atoms and other atoms included in the sacrificial layer 120 is higher than binding energy between first dopant atoms and second dopant atoms included in the first substrate, the sacrificial layer 120 serves to reduce the diffusion of arsenide (As) into the germanium (Ge) layer 140.

In an embodiment, when the sacrificial layer 120 is made of aluminum arsenide (AlAs), binding energy between aluminum (Al) and arsenide (As) is higher than binding energy between gallium (Ga) and arsenide (As). Accordingly, it is possible to reduce an amount of arsenide (As) diffused into the germanium (Ge) layer 140 even though the germanium (Ge) layer 140 is formed at the same growth temperature.

Referring back to FIG. 1, after the substrate 100, the sacrificial layer 120 and the germanium (Ge) layer 140 are formed, the germanium (Ge) layer 140 may be bonded to an insulating layer 220 on a substrate 200.

The substrate 200 (or referred to as a second substrate) is a substrate for forming the insulating layer 220 in the GeOI structure. In an embodiment, the substrate 200 may be made of silicon (Si), and the insulating layer 220 may be formed on the substrate 200. The insulating layer 220 may be a Buried Oxide Layer (BOX) formed on the surface of the silicon (Si) substrate 200. However, this is for illustration purposes only, and the substrate 200 may be made of materials other than silicon (Si).

The bonding may be performed by the common wafer bonding technique. In an embodiment, before the bonding, a process of removing a natural oxide film formed on the surface of the germanium (Ge) layer 140 and/or the insulating layer 220 is further performed. Additionally, before the bonding, the surface of the germanium (Ge) layer 140 and/or the insulating layer 220 is activated by plasma treatment.

Etching of the sacrificial layer 120 is performed after the germanium (Ge) layer 140 is bonded to the insulating layer 220. The etching is performed with the controlled etch selectivity to etch the sacrificial layer 120 but not the germanium (Ge) layer 140. In an embodiment, an etching solution used to etch the sacrificial layer 120 may be a hydrophilic solution including hydrogen fluoride (HF), for example, a solution in which hydrogen fluoride (HF) and deionized water (DIW) are mixed at a predetermined ratio. Additionally, the etching solution may further include isopropyl alcohol (IPA) and/or acetone to suppress the gas bubbling.

When the sacrificial layer 120 is completely removed, the first substrate 100 is split from the germanium (Ge) layer 140. When the ELO process is finished as described above, a semiconductor device of GeOI structure is obtained as shown in FIG. 1. The semiconductor device may be used as N-MOSFET or P-MOSFET according to the concentration of dopant atoms included in the germanium (Ge) layer 140.

In addition, a separate layer may be further formed to control the concentration of dopant atoms in the annealing process.

Figure 4:
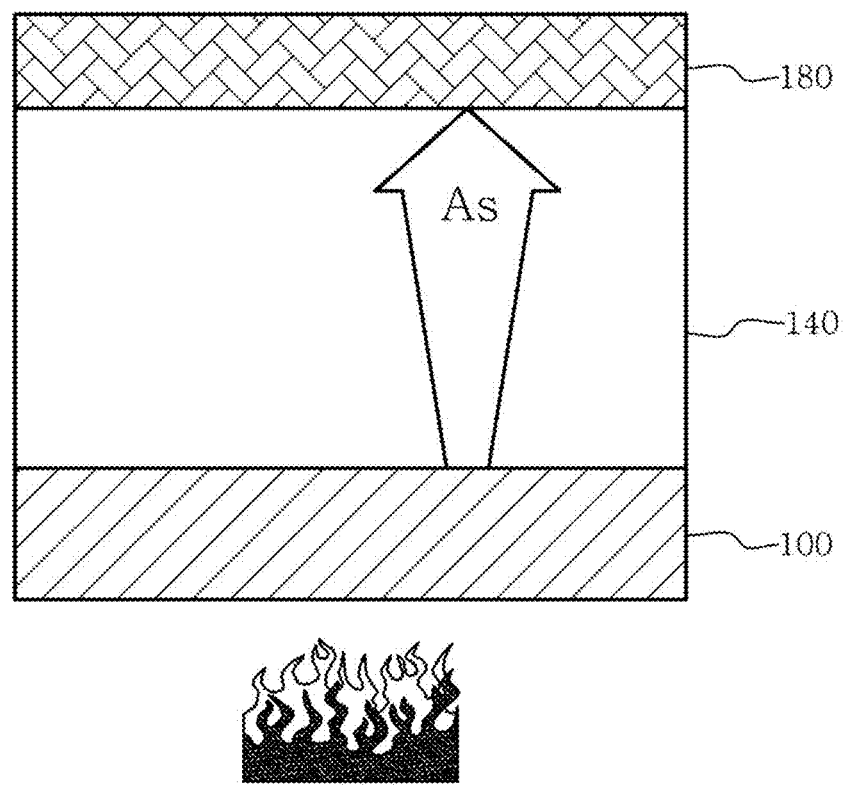
FIG. 4 is a conceptual diagram showing a capping layer that suppresses the escape of dopant atoms.
Figure 5:
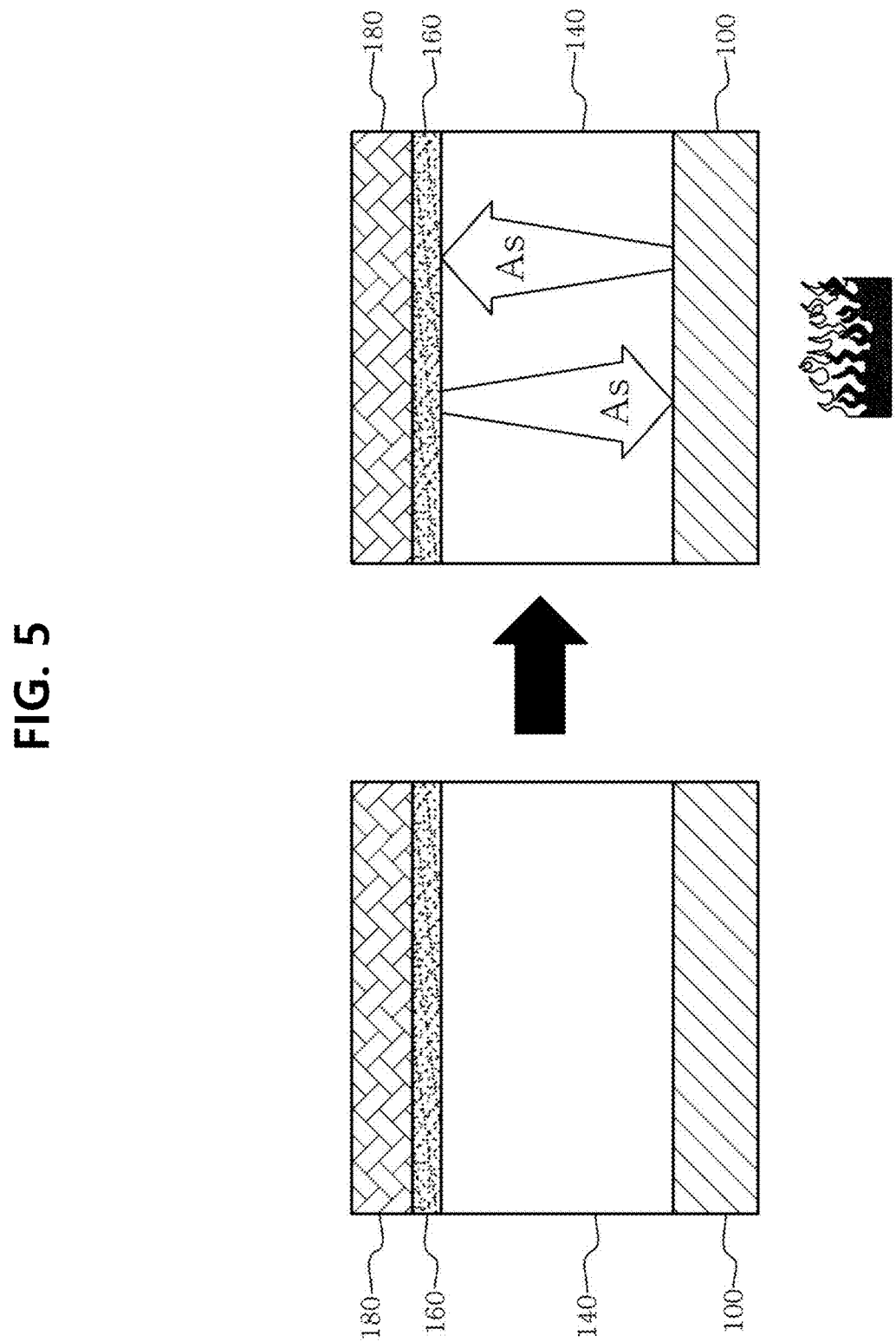
FIG. 5 is a conceptual diagram showing a capping layer that further supplies dopant atoms according to a first embodiment.

FIG. 4 is a conceptual diagram showing a capping layer that suppresses the escape of dopant atoms, and FIG. 5 is a conceptual diagram showing a capping layer that further supplies dopant atoms according to the first embodiment.

Referring to FIG. 4, in an embodiment, a capping layer 180 (hereinafter referred to as a first capping layer) acting as a diffusion barrier is formed on the germanium (Ge) layer 140. When the first capping layer 180 is formed after growth of germanium (Ge), arsenide (As) dopant atoms diffused into the germanium (Ge) layer 140 are prevented from escaping from the germanium (Ge) layer 140. In an example, when the first capping layer 180 is formed, an amount of arsenide (As) dopant atoms escaping from the germanium (Ge) layer 140 is suppressed by about 40%.

In an embodiment, the first capping layer 180 is made of one selected from the group consisting of silicon oxide ($SiO_2$), silicon nitride ($SiN_x$), aluminum oxide ($Al_2O_3$) and yttrium oxide ($Y_2O_3$) or combinations of at least two of them.

Because arsenide (As) dopant atoms included in the germanium (Ge) layer 140 are prevented from escaping as described above, a high concentration of arsenide (As) dopant atoms may be obtained, and in particular, a higher concentration of arsenide (As) dopant atoms may be obtained in the upper part within the germanium (Ge) layer 140. Accordingly, it is possible to obtain a semiconductor device of germanium (Ge) structure having lower contact resistance.

Additionally, the presence of the capping layer 180 on the surface of the germanium (Ge) layer 140 may prevent a phenomenon in which the surface of the germanium (Ge) layer 140 becomes rough at high annealing temperature.

Referring back to FIG. 1, the first capping layer 180 is removed, and then the germanium (Ge) layer 140 is bonded to the insulating layer 220. In an embodiment, an etching solution used to etch the first capping layer 180 may include phosphoric acid ($N_3PO_4$). In another embodiment, the first capping layer 180 may be removed by dry etching performed under a vacuum with an addition of fluorine-based gas and inactive gas.

In still another embodiment, the first capping layer 180 which is formed on the germanium (Ge) layer 140 may be then bonded to the insulating layer 220. Further, in some embodiments, when the first capping layer 180 and the insulating layer 220 are formed from the same material and bonded together (for example, when the first capping layer 180 formed from yttrium oxide ($Y_2O_3$) is generated and bonded to the insulating layer 220 formed from yttrium oxide ($Y_2O_3$)), the use of the same material for both the diffusion barrier and bonding medium of wafer bonding may further reduce the process cost.

Referring to FIG. 5, in an embodiment, before forming the first capping layer 180, another capping layer (hereinafter referred to as a second capping layer) 160 is formed on the germanium (Ge) layer 140. The second capping layer 160 is formed with an amorphous structure of arsenide (As) on the germanium (Ge) layer 140 after growth of germanium (Ge).

After the first capping layer 180 is formed on the second capping layer 160, annealing is performed. Then, arsenide (As) atoms in the second capping layer 160 are diffused down into the germanium (Ge) layer 140 by thermal desorption.

Accordingly, gallium (Ga) is not supplied to the germanium (Ge) layer 140, while not only arsenide (As) atoms on the first substrate 100 but also arsenide (As) atoms of the second capping layer 160 are supplied to the germanium (Ge) layer 140.

When the second capping layer 160 is formed as described above, the germanium (Ge) layer 140 having a higher concentration of arsenide (As) dopant atoms may be obtained, which makes it possible to an N-type semiconductor device having lower contact resistance.

Referring back to FIG. 1, the second capping layer 160 is removed, and then the germanium (Ge) layer 140 is bonded to the insulating layer 220. In an embodiment, after the first capping layer 180 is removed, the second capping layer 160 may be removed through thermal treatment. For example, when the second capping layer 160 is annealed at 300° C., the second capping layer 160 is removed by thermal desorption of amorphous arsenide because the first capping layer 180 is not on the second capping layer 160.

In another embodiment, the second capping layer 160 may be bonded to the insulating layer 220 without being removed. Here, that case that the second capping layer 160 is bonded to the insulating layer 220 without being removed encompasses the case that the second capping layer 160 which is formed on the germanium (Ge) layer 140 is then bonded to the insulating layer 220, or the case that the first capping layer 180 which is formed on the second capping layer 160 is then bonded to the insulating layer 220.

In addition, in the first embodiment, the surface orientation of the germanium (Ge) layer 140 may be appropriately determined, considering the charge mobility in the semiconductor device. In an example, when the sacrificial layer 120 and the germanium (Ge) layer 140 are formed by the epitaxy growth method using the substrate 100 with (110) surface orientation, the surface orientation of the germanium (Ge) layer 140 is also (110). Alternatively, in another example, when the sacrificial layer 120 and the germanium (Ge) layer 140 are formed by the epitaxy growth method using the substrate 100 with (111) surface orientation, the surface orientation of the germanium (Ge) layer 140 is also (111). Because germanium (Ge) has higher charge mobility at (110) and (111) surface orientation than (100) surface orientation, formation of the germanium (Ge) layer 140 having appropriate surface orientation may maximize the performance of the semiconductor device.

As described above, dissimilar to the conventional technology for obtaining an epitaxial germanium thin film by 1) forming a germanium (Ge) layer directly on a silicon substrate despite a lattice constant difference (about 4%), or 2) by germanium condensation through thermal oxidation of a silicon germanium ($Si_xGe_{1-x}$) buffer layer, the method for manufacturing a semiconductor device according to some embodiments of the present disclosure has the following advantages: 1) there is no lattice constant difference between the substrate and the germanium (Ge) layer, 2) there is no separate buffer layer, making it possible to manufacture a semiconductor device on a few to a few tens of nm scale, and 3) there is no need for a separate thermal oxidation process for germanium condensation.

Second Embodiment

Figure 6:
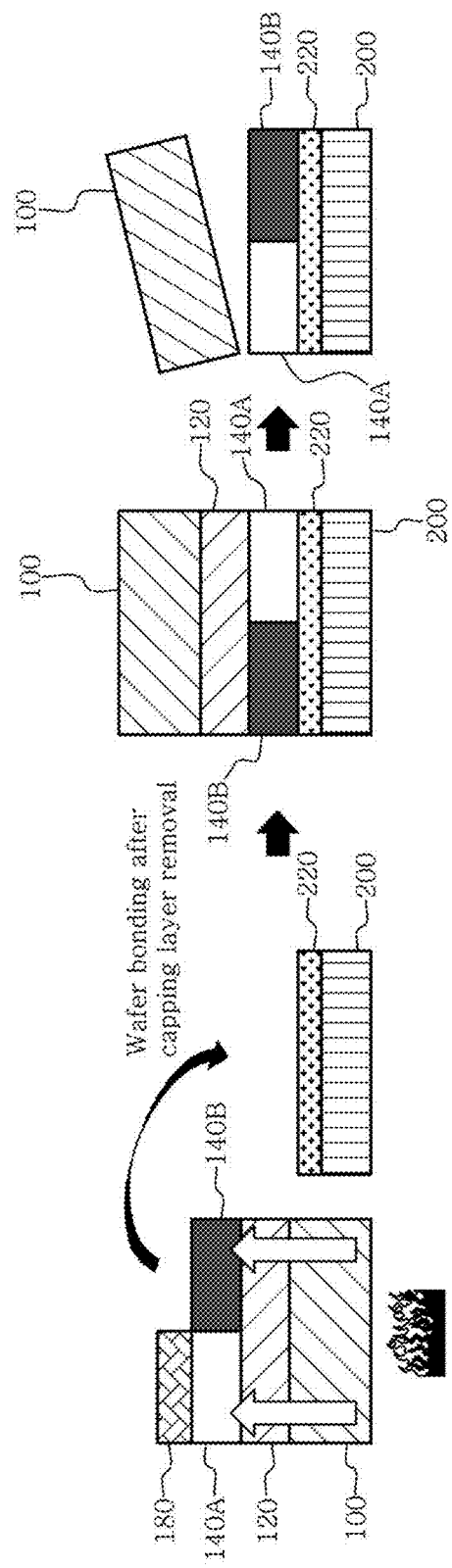
FIG. 6 is a conceptual diagram of a method for manufacturing Ge C-MOSFET-OI according to a second embodiment.
Figure 7:
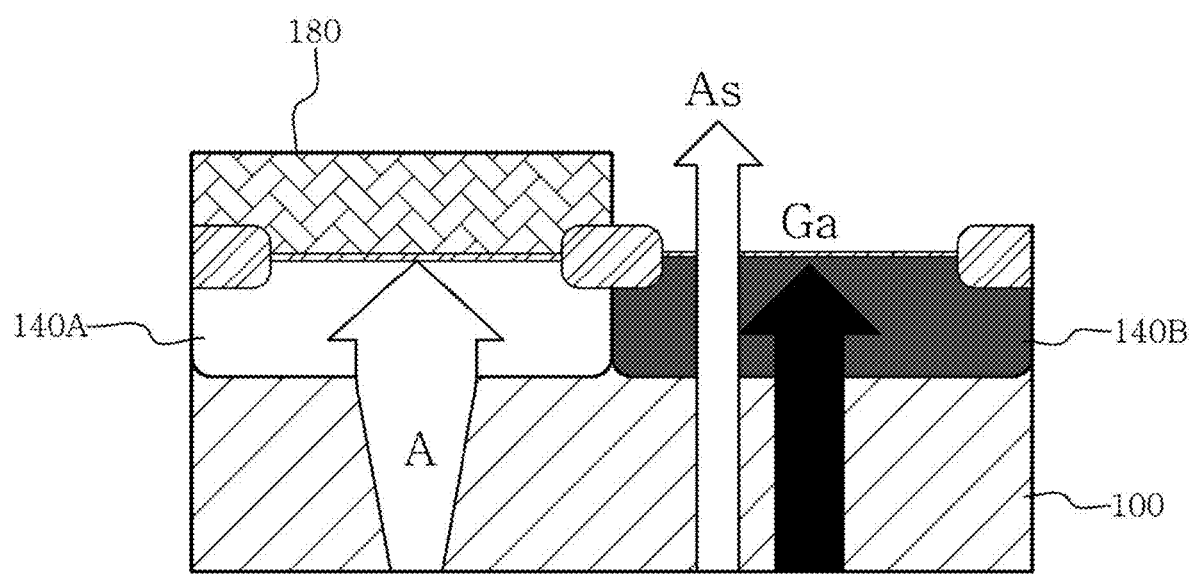
FIG. 7 is a cross-sectional view of a semiconductor device used to manufacture a complementary logic device according to a second embodiment.

FIG. 6 is a conceptual diagram of a method for manufacturing Ge C-MOSFET-OI according to a second embodiment, and FIG. 7 is a cross-sectional view of a semiconductor device used to manufacture Ge C-MOSFET-OI according to the second embodiment. The method for manufacturing a semiconductor device according to the second embodiment of the present disclosure is significantly similar to the method for manufacturing a semiconductor device according to the first embodiment of FIG. 1, and difference(s) will be primarily described.

In an embodiment, the step of forming the first capping layer 180 on the germanium (Ge) layer 140 may include the step of forming the first capping layer 180 on a portion of the surface of the germanium (Ge) layer 140.

As described above with reference to FIG. 5, when the first capping layer 180 is formed, arsenide (As) dopant atoms do not or less escape from the germanium (Ge) layer 140 even though annealing is performed after growth of germanium (Ge).

Accordingly, when the first substrate 100 is annealed after the first capping layer 180 is formed on the germanium (Ge) layer 140 in part, arsenide (As) atoms do not or less escape from the germanium (Ge) layer 140 in the germanium (Ge) region 140A where the first capping layer 180 is formed, exhibiting an N-type.

In contrast, arsenide (As) atoms escape from the germanium layer 140 and gallium (Ga) atoms diffuse into the germanium layer 140 in the germanium (Ge) region 140B where the first capping layer 180 is not formed, as a consequence, exhibiting a P-type. Finally, as shown in FIG. 7, a semiconductor device may be obtained in which a portion 140A of the germanium (Ge) layer 140 formed on the first substrate 100 is N-type, and the other portion 1408 is P-type.

As described above, instead of ion implantation requiring high energy, inter-diffusion is used in determining the polarity of the germanium (Ge) layer 140, thereby obtaining a high quality germanium (Ge) structure. Additionally, inter-diffusion and dopant atom activation are concurrent, resulting in a high activation yield.

Further, it is possible to partially control the polarity of the germanium (Ge) layer 140 using inter-diffusion of gallium (Ga) atoms and arsenide (As) atoms, making it possible to manufacture a semiconductor device on the substrate of the same type.

In addition, when the gallium (Ga) concentration in the P-type region 140B is high, annealing may be additionally performed to allow gallium (Ga) to escape from the germanium (Ge) layer 140. Accordingly, the gallium (Ga) concentration may be reduced.

In addition, a variety of layer formation and/or layer treatment processes may be performed to control the concentration of dopant atoms in the germanium (Ge) layer 140, but they are similar to the method for manufacturing a semiconductor device according to the first embodiment, and a detailed description is omitted herein.

As described above, a semiconductor device of FIG. 7 may be obtained in which a portion is N-type and the other portion is P-type through thermal treatment after generating a silicon nitride ($SiN_x$) mask once, and additionally, this may be used to manufacture C-MOSFET. Accordingly, the process may be simplified compared to the conventional method for manufacturing C-MOSFET involving covering with a mask, implanting N-type dopant atoms, covering with a mask again on the opposing side and implanting P-type dopant atoms.

Referring back to FIG. 6, after the first substrate 100, the sacrificial layer 120 and the germanium (Ge) layer 140 are formed, the germanium (Ge) layer 140 is made such that a portion is N-type and the other portion is P-type, and the germanium (Ge) layer 140 is bonded to the insulating layer 220 on the second substrate 200. After the germanium (Ge) layer 140 is bonded to the insulating layer 220, the sacrificial layer 120 is etched.

When the sacrificial layer 120 is completely removed, the first substrate 100 is split from the germanium (Ge) layer 140. When the ELO process is finished as described above, a semiconductor device of GeOI (Ge C-MOSFET-OI) structure for C-MOSFET is obtained.

The present disclosure has been hereinabove described with reference to the embodiments shown in the drawings, but this is provided for illustration purposes only and those having ordinary skill in the corresponding field will understand that various modifications and variations may be made thereto. However, it should be noted that such modifications fall within the technical protection scope of the present disclosure. Accordingly, the true technical protection scope of the present disclosure shall be defined by the technical spirit of the appended claims.

What is claimed is:

1. A method for manufacturing a semiconductor device, comprising:
   forming a sacrificial layer on a first substrate including first dopant atoms and second dopant atoms; and
   forming a germanium (Ge) layer on the sacrificial layer, forming an insulating layer on a second substrate;
   bonding the germanium (Ge) layer onto the insulating layer directly or indirectly; and
   etching the sacrificial layer with the germanium (Ge) layer being bonded to the insulating layer, to split the sacrificial layer and the first substrate,
   wherein the germanium (Ge) layer includes the first dopant atoms diffused from the first substrate by growth temperature in forming the germanium (Ge) layer.

2. The method for manufacturing a semiconductor device according to claim 1, further comprising:
   annealing the first substrate, comprising:
   decreasing concentration of the first dopant atoms included in the germanium (Ge) layer based on escapement of the first dopant atoms.

3. The method for manufacturing a semiconductor device according to claim 2, wherein the annealing the first substrate further comprises increasing concentration of the second dopant atoms included in the germanium (Ge) layer based on delayed diffusion of the second dopant atoms.

4. The method for manufacturing a semiconductor device according to claim 2, further comprising:
   forming a first capping layer on the germanium (Ge) layer before annealing the first substrate,
   the first capping layer prevents the first dopant atoms in the germanium (Ge) layer from escaping the germanium (Ge) layer.

5. The method for manufacturing a semiconductor device according to claim 4, further comprising:
   removing the first capping layer after annealing the first substrate.

6. The method for manufacturing a semiconductor device according to claim 4, further comprising:
   forming a second capping layer including the first dopant atoms on the germanium (Ge) layer before forming the first capping layer the second capping layer has an amorphous structure; and
   annealing the second capping layer after forming the first capping layer.

7. The method for manufacturing a semiconductor device according to claim 6, further comprising:
   removing the second capping layer after removing the first capping layer.

8. The method for manufacturing a semiconductor device according to claim 4, wherein the forming the first capping layer on the germanium (Ge) layer comprises forming the first capping layer on a portion of surface of the germanium (Ge) layer.

9. The method for manufacturing a semiconductor device according to claim 1, wherein the sacrificial layer includes one selected from the group consisting of gallium arsenide (GaAs), aluminum arsenide (AlAs) and aluminum gallium arsenide (AlGaAs) or combinations of at least two of them.

10. The method for manufacturing a semiconductor device according to claim 9, wherein the sacrificial layer has binding energy between the first dopant atoms and other atoms included in the sacrificial layer that is higher than binding energy between the first dopant atoms and the second dopant atoms included in the first substrate.

11. The method for manufacturing a semiconductor device according to claim 1, wherein the first substrate is made of gallium arsenide (GaAs), and the sacrificial layer is formed on the first substrate by an epitaxy growth method.

12. The method for manufacturing a germanium structure according to claim 11, wherein surface orientation of the first substrate is any one of (100), (110) and (111).

* * * * *